United States Patent [19]

Demmer et al.

[11] Patent Number: 4,839,253

[45] Date of Patent: Jun. 13, 1989

[54] PHOTOSENSITIVE AND ELECTRODEPOSITABLE PHENOLIC RESIN WITH QUINONE DIAZIDE SULFONYLOXY GROUP

[75] Inventors: Christopher G. Demmer, Cherry Hinton; Edward Irving, Burwell, both of United Kingdom

[73] Assignee: Ciba-Geigy Corporation, Ardsley, N.Y.

[21] Appl. No.: 91,328

[22] Filed: Aug. 28, 1987

Related U.S. Application Data

[63] Continuation of Ser. No. 800,846, Nov. 22, 1985, abandoned.

[30] Foreign Application Priority Data

Dec. 1, 1984 [GB] United Kingdom ............... 8430377

[51] Int. Cl.$^4$ .................. G03C 1/54; G03C 1/495; C08G 8/32; C08L 61/14
[52] U.S. Cl. ................... 430/190; 430/165; 430/168; 430/313; 430/318; 430/323; 430/326; 204/181.6; 204/181.7; 522/35; 522/39; 522/166; 522/904; 525/504; 525/505; 525/508
[58] Field of Search ............. 430/190, 192, 193, 165, 430/168; 204/181.7, 181.6; 525/504, 505, 508; 522/35, 39, 166, 904

[56] References Cited

U.S. PATENT DOCUMENTS

| | | | |
|---|---|---|---|
| 3,859,099 | 1/1975 | Petropoulos et al. | 430/190 |
| 3,902,906 | 9/1975 | Iwama et al. | 430/190 |
| 4,139,384 | 2/1979 | Iwasaki et al. | 430/190 |
| 4,266,001 | 5/1981 | Buhr et al. | 430/192 |
| 4,306,010 | 12/1981 | Uehara et al. | 430/190 |
| 4,362,853 | 12/1982 | Demmer | 525/533 |
| 4,410,675 | 10/1983 | Demmer | 525/533 |
| 4,493,884 | 1/1985 | Nagano et al. | 430/190 |
| 4,507,446 | 3/1985 | Demmer | 525/523 |
| 4,578,438 | 3/1986 | Demmer et al. | 525/481 |
| 4,590,245 | 5/1986 | Daimer et al. | 204/181.7 |
| 4,592,816 | 6/1986 | Emmons et al. | 204/181.7 |
| 4,632,900 | 12/1986 | Demmer et al. | 430/192 |
| 4,681,923 | 7/1987 | Demmer et al. | 525/504 |

FOREIGN PATENT DOCUMENTS

| | | |
|---|---|---|
| 83971 | 7/1983 | European Pat. Off. |
| 1227602 | 4/1971 | United Kingdom |
| 1329888 | 9/1973 | United Kingdom |
| 1330932 | 9/1973 | United Kingdom |

*Primary Examiner*—Charles L. Bowers, Jr.
*Attorney, Agent, or Firm*—Luther A. R. Hall

[57] ABSTRACT

An electrodepositable photosensitive resin which is a phenolic novolak resin having
(i) at least part of the phenolic hydroxyl groups thereof replaced by a quinone diazide sulphonyloxy group, and
(ii) at least part of the aromatic rings thereof substituted in a position ortho and/or para to a phenolic hydroxyl group or quinone diazide sulphonyloxy group by a group of formula —CH($R^1$)$R^2$ where $R^1$ represents a hydrogen atom, or an alkyl, aryl or carboxylic acid group, and $R^2$ represents a sulphonic acid group —SO$_3$H or a group of formula —A—$R^3$—X, $R^3$ represents an aliphatic, aromatic or araliphatic divalent group which may be substituted by a carboxlic, sulphonic or phosphonic acid group, A represents a sulphur atom or a group of formula —N($R^4$)—, where $R^4$ represents a hydrogen atom or an alkyl group which may be substituted by a carboxylic acid group or by an optionally etherified hydroxyl group, or $R^3$ and $R^4$ together represent an alkylene chain of 2 to 5 carbon atoms linked to the indicated nitrogen atom, which may contain an oxygen atom or an additional nitrogen atom in the chain, and X denotes a carboxylic or sulphonic acid group or, where A denotes —N($R^4$)—, X may further represent a phosphonic acid group, an amino group of formula —N($R^5$)($R^6$), a hydrogen atom or a hydroxyl group, and Rhu 5 and $R^6$ which may be the same or different, each represent a hydrogen atom or an alkyl, aryl, aralkyl or alkenyl group, any of which may be substituted by a hydroxyl group.

The resins are useful in the manufacture of printed circuits.

9 Claims, No Drawings

PHOTOSENSITIVE AND ELECTRODEPOSITABLE PHENOLIC RESIN WITH QUINONE DIAZIDE SULFONYLOXY GROUP

This is a continuation of application Ser. No. 800,846, filed on Nov. 22, 1985, now abandoned.

This invention relates to new modified phenolic resin products and to processes for their preparation, these new products being both photosensitive and electrodepositable.

Photosensitive phenolic novolak resins are well known and are used mainly in the preparation of presensitised lithographic plates. They are usually prepared by condensation of a phenolic resin with a quinone diazide sulphonyl chloride, giving a product having photosensitivity due to the presence of the quinone diazide groups, and good adhesion and toughness, due to the presence of the novolak resin 'backbone'. Plates coated with these materials withstand the mechanical wear of the lithographic printing process.

In British Patent Specification No. 1 227 602, for example, there is described a presensitised lithographic plate having a layer of water-insoluble condensation product that is an ester of a benzo- or naphthoquinone diazide sulphonic acid with a resin containing phenolic hydroxyl groups, a cresol-formaldehyde resin being exemplified. In British Patent Specification No. 1 329 888 there is described a condensation product of a para-substituted phenolic resin, having an alkyl, aryl, alkoxy, sulphoalkyl, aryloxy aralkyloxy, carboalkoxy, aralkyl or acetyl group para to the phenolic hydroxyl group, with a sulphonyl chloride of o-benzoquinone diazide or o-naphthoquinone diazide. These condensation products are said to be especially useful in the preparation of presensitised plates for photomechanical processes.

British Patent Specification No. 1 330 932 describes condensation products of benzo- or naphthoquinonediazide sulphonyl chlorides with novolaks made from a bisphenol and formaldehyde. These products are said to be useful in the preparation of presensitised plates for lithographic processes. Finally U.S. Pat No. 4,306,010 described condensation products of o-benzo- or o-naphtho-quinonediazide sulphonyl chlorides with a resin prepared from a polyhydric phenol, such as a resorcinol-benzaldehyde resin or a resorcinol-4-methylbenzaldehyde resin. These products are said to be suitable for the preparation of photosensitive plates for use in lithography.

The electrodeposition of positive-working photoresists has the advantage that very uniform coverage is obtainable, which is particularly important on edges and in plated through-holes, using relatively thin films of the photoresist. The use of thin, uniform films offers the potential of improved resolution compared with conventional film and liquid photoresists. A further advantage is that there is a reduced need for large 'rest rings', or 'islands' to support photopolymer films above plated through-holes, and hence a greater area of the circuit board is available for conductor tracks. Also, electrodepositable photoresists can be formulated with a minimal organic solvent content and may be deposited at a very high solids content, giving important safety and environmental benefits. Finally, resist utilisation is very high and complete automation of the coating process is possible.

It has now been found that certain quinone diazide group-containing novolak resins may be electrodeposited to give coatings that are suitable for use in the manufacture of printed circuits, having the advantages listed above. The ability to electrodeposit such resins is dependent upon their being present as salts. The preparation of new resins having a photosensitive quinone diazide group, and a salt-forming group, usually a carboxylic acid or amino group, enables the required electrodepositability to be obtained with no loss of photosensitivity.

Quinone diazide-modified, carboxyl-containing novolak resins are known in which the carboxyl groups are derived solely from carboxyl-containing phenols such as p-hydroxybenzoic acid used for the preparation of the novolak. This is a need, however, for resins having better stability in electrodeposition media and improved resistance to developer in unirradiated areas after imagewise exposure.

Accordingly, this invention provides an electrodepositable photosensitive phenolic novolak resin having (i) at least part of the phenolic hydroxyl groups thereof replaced by a quinone diazide sulphonyloxy group, preferably a benzo- or naphtho-quinone diazide sulphonyloxy group, and (ii) at least part of the aromatic rings thereof substituted in a position ortho and/or para to a phenolic hydroxyl group or quinone diazide sulphonyloxy group by a group of formula —CH($R^1$)$R^2$ where $R^1$ represents a hydrogen atom, or an alkyl, aryl or carboxylic acid group, and $R^2$ represents a sulphonic acid group $SO_3H$ or a group of formula —A—$R^3$—X, $R^3$ represents an aliphatic, aromatic or araliphatic divalent group which may be substituted by a carboxylic, sulphonic or phosphonic acid group, A represents a sulphur atom or a group of formula —N($R^4$)—, where $R^4$ represents a hydrogen atom or an alkyl group which may be substituted by a carboxylic acid group or by an optionally etherified hydroxyl group, or $R^3$ and $R^4$ together represent an alkylene chain of 2 to 5 carbon atoms linked to the indicated nitrogen atom, which may contain an oxygen atom or an additional nitrogen atom in the chain, and X denotes a carboxylic or sulphonic acid group or, where A denotes —N($R^4$)—, X may further represent a phosphonic acid group, an amino group of formula —N($R^5$)$R^6$, a hydrogen atom or a hydroxyl group, and $R^5$ and $R^6$, which may be the same or different, each represent a hydrogen atom or an alkyl, aryl, aralkyl or alkenyl group, any of which may be substituted by a hydroxyl group.

The resin is preferably derived from a monohydric mononuclear phenol, especially phenol itself and/or an alkyl substituted phenol, or from a bisphenol. Usually at least 4% of the phenolic hydroxyl groups of the novolak resin are replaced by the quinone diazide sulphonyloxy group, and the resin contains sufficient free phenolic hydroxyl groups to render it soluble or dispersible in aqueous media. Preferably 10 to 75%, especially 10 to 50%, of the phenolic hydroxyls are replaced by quinone diazide sulphonyloxy groups. Some of the phenolic hydroxyls may be replaced by an ether group such as an alkoxy group in which the alkyl group may be substituted by a hydroxyl or alkoxy group, or an ester group other than a quinone diazide sulphonyloxy group, for example an acetyloxy, benzoyloxy, methanesulphonyloxy or p-toluenesulphonyloxy group. Usually at least 4% of the aromatic rings of the novolak resin are substituted by a group of formula —CH(R¹)R²; preferably 7 to 75% of the rings are substituted by such a group.

Preferred resins are those of formula

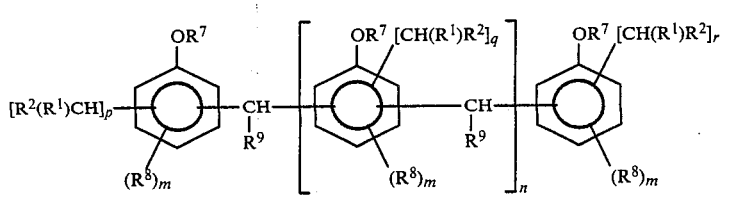

where

R¹ and R² are as hereinbefore defined,

R⁷ represents a hydrogen atom, an alkyl group which may be substituted by a hydroxyl or alkoxy group, or a group of formula —SO₂R¹⁰, —SO₂R¹¹, or —COR¹², at least 4% of the groups R⁷ representing a group —SO₂R¹⁰, R⁸ represents a halogen atom, a hydroxyl, alkoxy or optionally esterified carboxylic or sulphonic acid group; an alkyl, alkenyl or aryl group which may be substituted by a hydroxyl group or carboxylic acid group; or a group of formula —N(R¹³)R¹⁴, —COR¹², —OCOR¹², —OSO₂R¹⁰ or O—SO₂R¹¹; or one group R⁸ on each aromatic ring may represent a group of formula

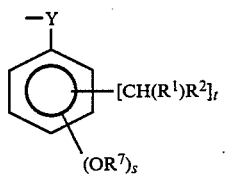

which may be connected to adjacent aromatic rings through groups of formula —CH(R⁹)—, R⁹ represents a hydrogen atom or an alkyl, aryl or carboxylic acid group, R¹⁰ represents a 1,2-benzoquinone diazide group or 1,2-naphthoquinone diazide group of formula

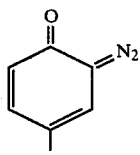

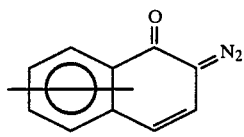

the free valency bond of the naphthoquinone group of formula IV being in the 4- or 5-position, R¹¹ and R¹² each represent a monovalent aliphatic, cycloaliphatic, aromatic or araliphatic group, R¹³ represents a hydrogen atom, an alkyl group or a group of formula —COR¹², —SO₂R¹⁰ or —SO₂R¹¹, R¹⁴ represents a hydrogen atom or an alkyl group, Y represents an oxygen or sulphur atom, a carbonyl or sulphonyl group, or an alkylene group of 1 to 8 carbon atoms optionally substituted by a halogen atom, a hydroxyl group which may be etherified or carboxyl group (which may be esterified) or an aryl group of 6 to 12 carbon atoms which may be substituted by a halogen atom or an optionally etherified hydroxyl group or an optionally esterified carboxyl group, m denotes zero, 1, 2 or 3, n denotes zero or an integer of 1 to 20, preferably 1 to 10, p, r and t each denote zero, 1 or 2, q denotes zero or 1, s denotes 1 or 2, the sum of p+nq+r+t is such that at least 4% of the indicated aromatic rings are substituted by a group of formula —CH(R¹)R² in a position ortho and/or para to a group —OR⁷, the sum of m+p, or m+r, is not more than 4, and the sum of m+q is not more than 3.

Preferably, 10 to 75%, especially 10 to 50%, of the groups R⁷ represent a group of formula —SO₂R¹⁰.

It is preferred, in order that the resin should be dilutable in aqueous media, that at least 25%, preferably at least 50%, of the groups R⁷ denote a hydrogen atom. Taking account of this preference, some of the groups R⁷, preferably not more than 40%, may denote a group of formula —SO₂R¹¹ or —COR¹², or an alkyl group which may be substituted by a hydroxyl or alkoxy group.

The sum of p+nq+r+t is preferably such that 7 to 75% of the indicated aromatic rings are substituted by a group of formula —CH(R¹)R².

It is preferred that alkyl, alkoxy and alkenyl groups within the definitions of R¹, R⁴, R⁵, R⁶, R⁷, R⁸, R¹³ and R¹⁴ have up to 20, especially up to 10, carbon atoms, aryl and aralkyl groups within the definitions of R¹, R⁵, R⁶, R⁸ and R⁹ have up to 20, especially up to 15, carbon atoms, divalent groups within the definition of R³ have up to 15, especially up to 10, carbon atoms when aliphatic, and up to 20, especially up to 15, carbon atoms when aromatic or araliphatic, and monovalent groups within the definitions of R¹¹ and R¹² have up to 20, and especially up to 15, carbon atoms when aliphatic, aromatic, or araliphatic, and up to 15, especially up to 10, carbon atoms when cycloaliphatic.

Preferably, R¹ represents a hydrogen atom, a methyl, ethyl or phenyl group or a carboxylic acid group. Resins in which R¹ represents a hydrogen atom are particularly preferred.

R² preferably represents a sulphonic acid group or a group of formula —A—R³—X where R³ represents an alkylene group of 1 to 6 carbon atoms, which may be substituted by a carboxylic acid group, or a phenylene group, A represents a sulphur atom or a group —N(R⁴)— where R⁴ represents a hydrogen atom or an alkyl group of 1 to 6 carbon atoms which may be substituted by a hydroxyl group, or carboxylic acid group, or R³ and R$^4$ together form an alkylene chain of 4 carbon atoms containing an oxygen atom or additional nitrogen atom in the chain, or an alkylene chain of 5 carbon atoms, X represents a carboxylic or sulphonic acid group when A represents a sulphur atom and, when A represents —N(R$^4$)—, X represents a carboxylic or sulphonic acid group, an amino group of formula —N(R$^5$)R$^6$ where R$^5$ and R$^6$ each represent a hydrogen atom or an alkyl group of 1 to 6 carbon atoms, a hydrogen atom or a hydroxyl group. Especially preferred groups R$^2$ include a sulphonic acid group, and groups of formulae —N(CH$_3$)CH$_2$COOH, —N(CH$_2$COOH)CH$_2$COOH, —NH-o-C$_6$H$_4$COOH, —NHCH$_2$COOH, —NHCH(COOH)(CH$_2$)$_2$COOH, —NHCH(COOH)CH$_2$COOH, —NH-p-C$_6$H$_4$COOH, —SCH$_2$COOH, —SCH(CH$_3$)COOH, —SCH$_2$CH$_2$COOH, —SCH(COOH)CH$_2$COOH, —NHCH$_2$CH$_3$, —N(CH$_2$CH$_3$)$_2$, —N[CH$_2$)$_5$CH$_3$]$_2$, —NHCH$_2$CH$_2$OH, —NHCH$_2$CH$_2$OCH$_3$, —N(CH$_2$CH$_2$OH)$_2$, —NH(CH$_2$)$_3$)OH, —NH(CH$_2$)$_4$OH, —NHCH$_2$CH$_2$NH$_2$ and —N<(CH$_2$CH$_2$)$_2$>O.

Where R$^7$ represents an optionally substituted alkyl group, it is further preferred that the alkyl group contains 1 to 4 carbon atoms, optionally substituted by a hydroxyl group or an alkoxy group of 1 to 4 carbon atoms, particularly preferred groups being methyl, ethyl, isopropyl, n-butyl, 2-hydroxyethyl, 2-hydroxypropyl, 2-methoxyethyl and 2-butoxyethyl groups.

Preferred atoms and groups R$^8$ include chlorine and bromine atoms, hydroxyl groups, alkoxy groups of 1 to 4 carbon atoms, alkyl groups of 1 to 8 carbon atoms, carboxylic acid groups, groups of formulae —OSO$_2$R$^{10}$, —OSO$_2$R$^{11}$ and —OCOR$^{12}$ and groups of formula II where Y represents a methylene, isopropylidene or carbonyl group or a group of formula —CH(COOH)— or —C(CH$_3$)[(CH$_2$)$_2$COOH]—. In especially preferred resins, either m denotes zero, so that R$^8$ is absent, or m denotes 1 and the several groups R$^8$ represent the same or different alkyl group having 1 to 8 carbon atoms or, in a further alternative, m denotes zero for some of the indicated aromatic rings in formula I and denotes 1 for the remainder of the rings, the various groups R$^8$ representing the same or different alkyl group having 1 to 8 carbon atoms. Particularly preferred alkyl groups R$^8$ are o-, m- and p-methyl, o-, m- and p-tert.butyl and o-, m- and p-octyl.

R$^9$ preferably represents a hydrogen atom, a methyl, ethyl or phenyl group or a carboxylic acid group. Resins in which R$^9$ represents a hydrogen atom are particularly preferred.

R$^{10}$ is preferably a 1,2-naphthoquinone diazide group of formula IV.

Preferred groups R$^{11}$ and R$^{12}$ include alkyl groups of 1 to 4 carbon atoms and aryl groups of 6 to 10 carbon atoms, especially methyl, phenyl and p-tolyl.

R$^{13}$ preferably represents a hydrogen atom, an alkyl group of 1 to 4 carbon atoms or a group of formula —SO$_2$R$^{10}$, —SO$_2$R$^{11}$ or —COR$^{12}$, where R$^{10}$, R$^{11}$ and R$^{12}$ are the preferred groups defined above. R$^{14}$ preferably represents a hydrogen atom or an alkyl group of 1 to 4 carbon atoms.

This invention also provides a process for the preparation of electrodepositable, photosensitive resins such as those described above which comprises reacting (A) a phenolic novolak resin, prepared from a phenol (B) and an aldehyde (C), with (D) a quinone diazide sulphonic acid or reactive derivative thereof, at least one of the novolak (A), the phenol (B), and the reaction product of the novolak (A) and the quinone diazide (D) being further reacted with (E) an aldehyde, and (F) a primary or secondary amine, an acid which is a compound having a primary or secondary amino group, or a mercapto group, and a carboxylic, sulphonic or phosphonic acid group, or which is sulphurous acid, or a water-soluble salt of any of the said acids.

The process is preferably effected either by reacting the phenolic novolak resin (A) with the quinone diazide sulphonic acid or its derivative (D) and then reacting the resulting product with the aldehyde (E) and with reactant (F), or by reacting the phenolic novolak resin (A) with the aldehyde (E) and reactant (F), and then reacting the resulting product with a quinone diazide sulphonic acid or its derivative (D).

Free phenolic groups on the resin may, if desired, be etherified by an etherifying agent (G), or be esterified by means of (H) an esterifying agent other than (D). This etherification or additional esterification can be carried out by reacting at least one of the electrodepositable photosensitive resin,
the novolak resin (A),
the reaction product of (A) with the quinone diazide sulphonic acid or derivative (D), and
the reaction product of (A), the aldehyde (E) and reactant (F)

with (G) the etherifying agent of (H) the esterifying agent other than (D).

The phenol (B) from which the novolak resin (A) is prepared may be monohydric or polyhydric and have one or more aromatic rings. Where the resin (A) is prepared from only one phenol (B), the latter should have 2 free positions ortho and/or para to the phenolic hydroxyl group. Where the resin (A) is prepared from a mixture of phenols (B), at least one of the phenols should have 2 free positions ortho and/or para to a phenolic hydroxyl group.

Preferred phenols (B) have the general formula

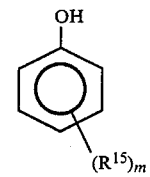

V where
m denotes zero, 1, 2 or 3,
R$^{15}$ has the same meaning as R$^8$ in formula I, with the proviso that it may not represent a group of formula II but instead may represent a group of formula

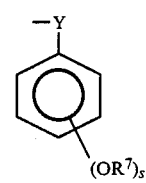

VI where Y, R$^7$ and s have the meanings assigned above.

Preferred values for m are as defined above and preferred atoms or groups R$^{15}$ are the same as the preferred atoms or groups R$^8$ as defined above. Thus suitable phenols (B) include o-, m- and p-chlorophenol, resorcinol, 2,2-bis(4-hydroxyphenyl)propane, bis(4-hydroxyphenyl)methane, 4,4'-dihydroxybenzophenone, 2,2-bis(4-hydroxyphenyl)acetic acid, 4,4-bis(4-hydroxyphenyl) pentanoic acid, p-hydroxybenzoic acid and mixtures of two or more of these phenols. Preferred phenols (B) are phenol itself, o-, m- and p-cresol, o-, m- and p-tert.butylphenol, o-, m- and p-octylphenol, and mixtures of two or more of these phenols. In especially preferred embodiments, (B) is a mixture of phenol and p-tert.butylphenol or a mixture of m- and p-cresols.

The aldehyde (C) from which the novolak (A) is prepared is preferably of formula $$R^9CHO \qquad \text{VII}$$

where $R^9$ and preferred atoms and groups $R^9$ are as defined above. Thus, preferred aldehydes include formaldehyde, acetaldehyde, propionaldehyde, benzaldehyde, and glyoxylic acid, whilst formaldehyde is particularly preferred.

Reaction between the phenol (B) and the aldehyde (C) to form the novolak resin may be effected following conventional practice for the preparation of novolaks, the phenol being heated with one molar equivalent, or less, of the aldehyde in the presence of an acid.

The quinone diazide derivative (D) is preferably of formula $$R^{10}SO_2Z \qquad \text{VIII}$$

where
$R^{10}$ and preferred groups $R^{10}$ are as defined above, and
Z represents a hydroxyl group an alkoxy group, preferably of 1 to 4 carbon atoms, or a halogen atom especially a chlorine atom.

Preferably (D) is 1,2-naphthoquinone-2-diazide-4- or 5-sulphonyl chloride or 1,2-benzoquinone-2-diazide-4-sulphonyl chloride. Reaction between (D) and the phenolic novolak (A) or the phenol (B) or the reaction product of the phenolic novolak (A), the aldehyde (E) and the reactant (F) is usually effected in an inert solvent, such as a ketone or ether, at ambient temperature and in the presence of a suitable condensing agent, which may be an acid when Z represents a hydroxyl or alkoxy group, or a base when Z represents a halogen atom. The use of an equivalent amount, or slight excess, of the quinone diazide (D) per free phenolic hydroxyl group on the novolak (A) or the phenol (B) gives a fully esterified product. However in order to achieve good solubility in the product, it is preferred if the product still retains some free phenolic hydroxyl group content and therefore less than one equivalent of the quinone diazide derivative (D) is preferably used. Amounts of quinone diazide derivative (D) within the range 0.1 to 0.75, especially 0.1 to 0.5, moles per equivalent of phenolic hydroxyl group in the novolak (A) or the phenol (B) are preferred.

The aldehyde (E) is preferably of formula $$R^1CHO \qquad \text{IX}$$

where $R^1$ and preferred groups $R^1$ are as defined above. This aldehyde may be the same as, or different to, the aldehyde (C) used in preparing the novolak (A). Preferably it is formaldehyde, used as such or in the form of paraformaldehyde.

The reactant (F) is preferably of formula $$M_2SO_3 \qquad \text{X}$$

or
$$H-A-R^3-X \qquad \text{XI}$$

where M denotes a hydrogen atom or a monovalent metal atom, and $R^3$, A and X and preferred atoms or groups $R^3$, A and X are as defined above.

Preferably, therefore, the reactant (F) is an alkali metal sulphite, a primary or secondary alkylamine in which one or more of the alkyl groups may be substituted by alkoxy, an alkylenediamine, a heterocyclic compound with a ring amino nitrogen atom linked to an alkylene chain of 4 carbon atoms which may contain an oxygen atom or an additional nitrogen atom in the chain, or linked to an alkylene chain of 5 carbon atoms, a hydroxyamine, an aminocarboxylic acid having an amino group and a carboxyl group attached to an aliphatic, aromatic, or araliphatic residue, or a mercaptocarboxylic acid having a mercaptan group and a carboxyl group attached to an aliphatic, aromatic, or araliphatic residue.

Particularly preferred reactants (F) include sodium sulphite, ethylamine, 2-methoxyethylamine, diethylamine, dihexylamine, ethylenediamine, ethanolamine, diethanolamine, propanolamine, butanolamine, morpholine, sarcosine, iminodiacetic acid, anthranilic acid, glycine, glutamic acid, aspartic acid, p-aminobenzoic acid, thioglycolic acid, 2- or 3-mercaptopropionic acid, and thiomalic acid.

The optional etherifying agent (G) may be conventional etherifying agent, for example an alcohol such as methanol, ethanol, isopropanol, n-butanol, ethylene glycol, 2-methoxyethanol, or 2-butoxyethanol, an alkylene oxide such as ethylene or propylene oxide, a dialkyl sulphate such as dimethyl sulphate or an alkyl halide such as methyl iodide.

The optional esterifying agent (H) is usually a carboxylic or sulphonic acid or its derivative, of formula $$R^{11}SO_2Z \qquad \text{XII}$$

or
$$R^{12}COZ \qquad \text{XIII}$$

where $R^{11}$, $R^{12}$ and Z, and preferred atoms or groups $R^{11}$, $R^{12}$ and Z, are as hereinbefore defined. Preferred such esterifying agents include acetyl chloride, benzoyl chloride, methanesulphonyl chloride, and p-toluenesulphonyl chloride.

Reaction between the aldehyde (E), the reactant (F) and the novolak (A) or the reaction product of the novolak (A) and the quinone diazide (D) is usually effected in an inert solvent such as an alcohol, alkoxy alcohol, ketone or ether, at ambient or elevated temperature, especially at 40°-180° C., in the presence of sufficient of a base to neutralise, at least partially, any free acid. The amount of reactant (F) used is preferably such that 0.04 to 2.0, especially 0.07 to 0.8, moles of (F) are present per equivalent of phenolic hydroxyl group in the novolak (A) or in the reaction product of novolak (A) and the quinone diazide (D). An excess of the aldehyde (E) over (F) is normally used, 1.1 to 4.0 moles of aldehyde (E) per mole of reactant (F) being preferred.

The optional etherification stage using esterifying agent (H) is usually effected in an inert solvent, such as a ketone or ether at ambient temperature and in the presence of a suitable condensing agent, which may be a strong acid when Z represents a hydroxyl or alkoxy group, or a base when Z represents a halogen atom. The amount of (H) is preferably not more than 0.4 mole per equivalent of phenolic hydroxyl in (A).

The optional etherification stage using (G) may be carried out using conventional methods for the etherification of phenolic resins, preferably using not more than 0.4 mole of (G) per equivalent of phenolic hydroxyl in (A).

It will be understood that when the phenolic hydroxyl groups in a novolak resin are partially reacted with one or more esterifying agents, the modified resin will contain, in addition to molecules where some of the aromatic rings have free hydroxyl groups and the other aromatic rings have esterified hydroxyl groups, molecules where all of the aromatic rings have free hydroxyl groups and molecules where all of the aromatic rings have esterified hydroxyl groups. Thus formulae such as formula I representing such resins are statistical representations, allowing $R^7$ to denote hydrogen atoms on some rings, groups $SO_2R^{10}$ on other rings, groups $SO_2R^{11}$ on further rings and groups $COR^{12}$ on yet further rings. Similar considerations apply to formula I in so far as it represents resins derived from a mixture of different phenols and resins where some of the rings are substituted by a residue $CH(R^1)R^2$ and the other rings are not so substituted.

When used as electrodepositable photoresists the resins of the present invention are used in the form of salts thereof which are soluble or dispersible in aqueous, including aqueous organic, media. Thus, if they are prepared in media such that they are present as salts, the media containing these salts can be used directly in the electrodeposition process. If the resins are isolated as acids or bases, before use in the electrodeposition process they are converted into their salts by addition of a suitable acid or base, depending on whether the salt-forming groups in the residues $R^1$ and $R^2$, and other salt-forming groups which may be in the resins, are basic or acidic respectively. Suitable acids which may be used to form the salts include mineral acids such as hydrochloric and sulphuric acids, and organic acids such as acetic, propionic, lactic, maleic, and glycolic acids.

Suitable bases that may be used to form the salt include inorganic bases such as sodium or potassium hydroxide or carbonate and ammonia, and organic bases such as triethylamine, triethanolamine, benzyldimethylamine, dimethylethanolamine and dimethylaminomethylpropanol.

When used as photoresists, the salts of resins of the invention may be coated onto carriers to form photosensitive elements. Suitable carriers include metals such as aluminium and copper, either as a solid metal sheet or as a metal-faced laminate.

The resins of this invention may be used alone or, if desired, in admixture with substances that are soluble or dispersible in aqueous media and that improve the quality of the coating deposited. Typical such substances include acrylic, alkyd, polybutadiene and epoxide resins which are dilutable in aqueous media.

Electrodeposition of the new resins follows known procedures. Voltages of up to 200 volts for periods of up to 5 minutes are generally used, but the precise conditions for particular resins, substrates and desired thicknesses may be readily determined by those skilled in the art of electrodepositing resinous materials.

After electrodeposition the coatings are dried and may then be exposed to actinic radiation, preferably of wavelength 200 to 600 nm, usually through an image-bearing transparency. Development in a suitable aqueous or non-aqueous acid or base leaves a positive image upon the substrate. The following Examples illustrate the invention. All parts and percentages are by weight.

The novolak resins used as starting materials are as follows:

NOVOLAK I

This denotes a resin made from a novolak, prepared from 3 moles of phenol and 1 mole of p-tert.butylphenol and formaldehyde, by further reaction with 1,2-naphthoquinone-2-diazide-5-sulphonyl chloride. The product is of formula I in which $R^9$ represents hydrogen, 88% of the groups $R^7$ represent hydrogen and the remainder represent a 1,2-naphthoquinone-2-diazide-5-sulphonyl group, m denotes zero for 75% of the molecule and m denotes 1 for 25% of the molecule, in which case $R^8$ denotes p-tert.butyl, n denotes an integer of average value 7.1, and p, q and r are each zero.

NOVOLAK II

This denotes a novolak made from m-cresol, p-cresol, and formaldehyde, using oxalic acid as catalyst, in the molar ratio m-cresol:p-cresol:formaldehyde:oxalic acid = 0.5:0.5:0.75:0.006.

The novolak has a softening point of 136° C. and is of formula I in which $R^9$ represents hydrogen, $R^7$ represents hydrogen, m denotes 1, $R^8$ denotes m-methyl and p-methyl in equimolar proportion, p, q and r are each zero, and n denotes an integer of average value 4.9.

NOVOLAK III

This denotes a novolak made from phenol, p-tert.butylphenol, formaldehyde, and oxalic acid in the molar ratio 0.75:0.25:0.9:0.046.

The novolak has a softening point of 119° C. and is of formula I where $R^9$ represents hydrogen, $R^7$ represents hydrogen, m denotes zero for 75% of the molecule and m denotes 1 for 25% of the molecule, in which case $R^8$ denotes p-tert.butyl, n denotes an integer of average value 7.5 and p, q and r are each zero.

EXAMPLE 1

Novolak I (10 g) is dissolved in 2-butoxyethanol (50 g) and heated to 50° C. A solution of sarcosine (0.45 g), paraformaldehyde (0.33 g; 91% (HCHO)x), 20% aqueous sodium hydroxide (1 g), and 2-butoxyethanol (10 g) is added and the mixture is kept at 50° C. for 2 hours. The mixture is then cooled to ambient temperature and water (1000 ml) is added. Addition of N hydrochloric acid (10 ml) causes precipitation of a brown resinous solid. This is ground to a powder, washed with water, and dried in a vacuum oven at 35° C. to give 9.5 g of a product of formula I in which m denotes zero for 75% of the molecule and m denotes 1 for 25% of the molecule,
$R^8$ denotes p-tert.butyl,
$R^9$ denotes hydrogen,
$R^1$ denotes hydrogen,
88% of the groups $R^7$ denote hydrogen and 12% denote 1,2-naphthoquinone-2-diazide-5-sulphonyl,
$R^2$ represents a group —N(CH$_3$)CH$_2$COOH,
(p+nq+r) has an average value such that 8% of the indicated aromatic rings are substituted by the group —CH($R^1$)$R^2$, and
n represents an integer of average value 7.1.

Its infrared spectrum, measured on a KBr disc, shows absorption maxima at 3350, 2940, 2860, 2150, 2100, 1600, 1500, 1470, 1450, 1430, 1360, 1250, 1190, and 1100 cm$^{-1}$.

This product (4 g) is added slowly to a mixture of 2-butoxyethanol (4 g) and 20% aqueous potassium hydroxide, to obtain a clear, red-brown solution which is further diluted with water until it contains 10% of the product. This product is electrodeposited onto a copper-clad laminate anode, using a stainless steel cathode. A deposit 29 micrometres thick forms after 20 seconds at 40 volts. The laminate is withdrawn from the bath, rinsed with water, and dried for 5 minutes at 90° C. It is then irradiated through an image-bearing transparency for 1 minute; using a 5000w medium pressure mercury halide lamp at a distance of 75 cm. Immersion in 2% aqueous sodium hydroxide gives a clear positive image of the transparency.

The exposed copper is removed by etching in a 40% aqueous solution of ferric chloride at 30° C., after which the plate is washed with water and dried. The residual coating is then removed by exposure a second time to the 5000w lamp for 1 minute, without the image-bearing transparency, and immersion in 2% aqueous sodium hydroxide.

EXAMPLE 2

Example 1 is repeated, using Novolak I (10 g), sarcosine (0.89 g), paraformaldehyde (0.66 g), 20% aqueous sodium hydroxide (2 g), and 2-butoxyethanol (60 g). The product is a resin of formula I in which
m denotes zero or 1, the ratio of m=0 to m=1 being 3:1,
$R^8$ denotes p-tert.butyl,
$R^1$ and $R^9$ both denote hydrogen,
88% of the groups $R^7$ denote hydrogen and 12% denote 1,2-naphthoquinone-2-diazide-5-sulphonyl,
$R^2$ represents a group —N(CH$_3$)CH$_2$COOH,
(p+nq+r) has a value such that 15% of the aromatic rings are substituted by the group —CH($R^1$)$R^2$, and
n represents an integer of average value 7.1.

This resin, which has a similar infrared absorption spectrum to that of the product of Example 1, can be electrocoated onto a substrate, and a positive image formed, as described in Example 1.

EXAMPLE 3

Novolak II (12 g) is dissolved in a mixture of acetone (30 g) and dioxan (30 g) and treated with a solution of 1,2-naphthoquinone-2-diazide-5-sulphonyl chloride (4 g) in acetone (10 g) and dioxan (10 g). The mixture is adjusted to pH 8 by addition of 10% aqueous sodium carbonate, then stirred at room temperature for 90 minutes. It is poured into 3N hydrochloric acid solution (100 ml) and the precipitate is filtered, washed with water and dried in a vacuum oven at 35° C.

This product (10 g) is dissolved in 2-butoxyethanol (50 g) and heated to 50° C. A solution of sarcosine (0.45 g), paraformaldehyde (0.33 g), 20% aqueous sodium hydroxide (1.0 g), and 2butoxyethanol (10 g) is added, and the mixture kept at 50° C. for 3 hours. The mixture is diluted with water (500 ml) and the product precipitated by addition of N hydrochloric acid solution. This is washed with water and dried in a vacuum oven at 35° C. to give 10 g of a product of formula I in which
$R^1$ denotes m-methyl and p-methyl in equimolar proportion,
m denotes 1,
$R^1$ and $R^9$ denote hydrogen,
86% of the groups $R^7$ denote hydrogen and 14% denote 1,2-naphthoquinone-2-diazide-5-sulphonyl,
$R^2$ represents a group —N(CH$_3$)CH$_2$COOH,
(p+nq+r) has an average value such that 7.4% of the aromatic rings are substituted by the group —CH($R^1$)$R^2$, and
n represents an integer average value 4.9.

Its infrared spectrum, measured on a KBr disc, shows absorption maxima at 3350, 2940, 2860, 2150, 2100, 1600, 1490, 1450, 1400, 1360, 1260, 1190, and 1100 cm$^{-1}$.

This product can be electrocoated onto a substrate and a positive image formed, as described in Example 1.

EXAMPLE 4

Novolak III (8 g) is dissolved in acetone (40 g) and treated with a solution of 1,2-naphthoquinone-2-diazide-5-sulphonyl chloride (4 g) in acetone (20 g). The mixture is adjusted to pH 8 with 5% aqueous sodium carbonate, then stirred for 1 hour at room temperature. It is poured into 3 N hydrochloric acid (100 ml) and the precipitate is filtered off, washed with water, and dried in a vacuum oven at 35° C. to give 10 g of product.

This product is dissolved in 2-butoxyethanol (50g), heated to 50° C. and added to a solution containing sarcosine (0.45 g), paraformaldehyde (0.33 g), 20% aqueous sodium hydroxide (1.0 g), and 2-butoxyethanol (25 g) and the mixture is heated at 50° C. for 2 hours. It is then added slowly to N hydrochloric acid (500 ml) and the yellow precipitate is filtered off, washed with water, and dried in a vacuum oven at 35° C. The product (10 g) is of formula I where
$R^8$ denotes p-tert.butyl
m denotes zero for 75% of the molecule and 1 for 25% of the molecule,
$R^1$ and $R^9$ denote hydrogen
78% of the groups $R^7$ denote hydrogen and 22% denote 1,2-naphthoquinone-2-diazide-5-sulphonyl,
$R^2$ represents a group —N(CH$_3$)CH$_2$COOH,
(p+nq+r) has an average value such that 9% of the aromatic rings are substituted by the group —CH($R^1$)$R^2$, and
n represents an integer of average value 7.5.

This resin, which has a similar infrared spectrum to that of the product of Example 1, may be electrodeposited onto a substrate, and a positive image formed, as described in Example 1.

EXAMPLE 5

Novolak III (50 g) is dissolved in 2-butoxyethanol (150 g) and treated with a solution containing sarcosine (2.25 g), paraformaldehyde (1.65 g), 20% aqueous sodium hydroxide (50 g), and 2-butoxyethanol (50 g). The mixture is heated at 80° C. for 4 hours, cooled to room temperature, diluted with water (2 liters) and adjusted to pH 3 with hydrochloric acid. A white, resinous precipitate forms and this is filtered off and dried. The dried product is ground to a powder, washed with water, and dried in a vacuum oven at 35° C. to give 46 g of a novolak of formula I wherein m denotes 1 for 25% of the molecule and zero for 75% of the molecule,
$R^8$ denotes p-tert.butyl,
$R^1$, $R^7$ and $R^9$ denote hydrogen atoms,
$R^2$ denotes a group $-N(CH_3)CH_2COOH$,
(p+nq+r) has an average value such that 6% of the aromatic rings are substituted by the group $-CH(R^1)R^2$, and
n represents an integer of average value 7.5.

This novolak (9 g) is dissolved in acetone (40 g) and a solution of 1,2-naphthoquinone-2-diazide-5-sulphonyl chloride (3 g) in acetone (20 g) is added. The solution is adjusted to pH 8 by addition of 10% aqueous sodium carbonate solution (16.6 g). The mixture is stirred at room temperature for 1 hour, and then added dropwise to N hydrochloric acid (500 ml). A yellow resinous precipitate is obtained and this is filtered off, washed with water, and dried in a vacuum oven at 35° C. to give 10 g of a similar product to that obtained in Example 4.

EXAMPLE 6

Example 2 is repeated, replacing the sarcosine used in that example by glycine (0.75 g). A product (10 g) is obtained which is a brown solid having an acid value of 0.8 equiv./kg and is of formula I where m denotes zero or 1, the ratio of m=0 to m=1 being 3:1,
$R^8$ denotes p-tert.butyl,
$R^1$ and $R^9$ both denote hydrogen,
88% of the groups $R^7$ denote hydrogen and 12% denote 1,2-naphthoquinone-2-diazide-5-sulphonyl,
$R^2$ denotes $-NHCH_2COOH$
(p+nq+r) has an average value such that 15% of the aromatic rings are substituted by the group $-CH(R^1)R^2$, and
n represents an integer of average value 7.1.

EXAMPLE 7

Novolak III (12 g) is dissolved in 2-butoxyethanol (50 g) and treated with diethanolamine (2.1 g), formalin (2.4 g; 38.3% HCHO) and 75% lactic acid (2.1 g). The mixture is heated at 80° C. for 3 hours, cooled to ambient temperature, diluted with water (1 liter) and adjusted to pH 6. A precipitate forms and is filtered off, washed, and dried in a vacuum oven at 35° C. to give 12 g of the lactate salt of a novolak of formula I where m denotes zero or 1, the ratio of m=0 to m=1 being 3:1,
$R^8$ denotes p-tert.butyl,
$R^1$, $R^7$, and $R^9$ denote hydrogen atoms,
$R^2$ denotes a group $-N(CH_2CH_2OH)_2$
(p+nq+r) has an average value such that 20% of the aromatic rings are substituted by the group $-CH(R^1)R^2$, and
n represents an integer of average value 7.5.

This novolak salt (12 g) is dissolved in acetone (40 g), and a solution of 1,2-naphthoquinone-2-diazide-5-sulphonyl chloride (3 g) in acetone (20 g), is added. The mixture is adjusted to pH 8 by addition of 5% aqueous sodium carbonate solution, and stirred for 1 hour at room temperature. It is then adjusted to pH 3 by addition of N/10 hydrochloric acid, giving a clear solution, and 20% aqueous sodium hydroxide added to pH 6, the solution forming a precipitate. The precipitate is filtered off and dried at 35° C. to give 10.6 g of product of formula I where m denotes zero or 1, the molar ratio m=0 to m=1 being 3:1,
$R^8$ denotes p-tert.butyl,
$R^1$ and $R^9$ denote hydrogen atoms,
89% of the groups $R^7$ denote hydrogen and 11% denote 1,2-naphthoquinone-2-diazide-5-sulphonyl;
$R^2$ denotes a group $-N(CH_2CH_2OH)_2$
(p+nq+r) has an average value such that 20% of the aromatic rings are substituted by the group $-CH(R^1)R^2$, and
n represents an integer of average value 7.5.

The infrared absorption spectrum, measured on a KBr disc, shows maxima at 3300, 2940, 2860, 2150, 2100, 1590, 1500, 1470, 1450, 1430, 1360, 1250, 1190 and 1080 cm$^{-1}$.

This product (4 g) is dissolved in 2-butoxyethanol (4 g) and diluted with water (32 g). The resin is electrodeposited onto a copper clad laminate cathode using a stainless steel anode. A deposit 6 micrometres thick forms after 20 seconds at 10 volts. The laminate is withdrawn from the bath, rinsed with water, and dried for 5 minutes at 90° C. It is then irradiated through an image bearing transparency for 1 minute, using a 5000w medium pressure mercury halide lamp at a distance of 75 cm. Immersion in 2% aqueous sodium hydroxide gives a clear positive image of the transparency.

EXAMPLE 8

Novolak I (10 g) is dissolved in 2-butoxyethanol (50 g) and heated to 50° C. A solution of diethanolamine (4.2 g), formalin (38.8% HCHO; 5.8 g), lactic acid (75%; 4.7 g) and 2-butoxyethanol (10 g) is added and the mixture stirred at 70° C. for 1½ hours. The mixture is then cooled to ambient temperature and water (1000 ml) is added. Addition of N sodium hydroxide produces a precipitate at pH 6 which is filtered off, washed and dried in a vacuum oven at 35° C. to give 10.8 g of a product of formula I where m denotes zero or 1, the molar ratio m=0 to m=1 being 3:1
$R^8$ denotes p-tert.butyl,
$R^1$ and $R^9$ denote hydrogen atoms,
88% of the groups $R^7$ denote hydrogen and 12% denote 1,2-naphthoquinone-2-diazide-5-sulphonyl,
$R^2$ denotes a group $-N(CH_2CH_2OH)_2$,
(p+nq+r) has an average value such that 60% of the aromatic rings are substituted by the group $-CH(R^1)R^2$, and
n represents an integer of average value 7.1.

The infrared absorption spectrum of this resin, measured on a KBr disc, shows maxima at 3350, 2940, 2860, 2150, 2100, 1590, 1500, 1470, 1450, 1430, 1360, 1250, 1190 and 1080 cm$^{-1}$.

The resin can be electrocoated onto a substrate and a positive image formed as described in Example 7.

EXAMPLE 9

Novolak III (36 g) is dissolved in 2-butoxyethanol (36 g) and thioglycolic acid (13.8 g) and paraformaldehyde (14.9 g) are added. The mixture is heated at 140° C. for 2 hours after which a vacuum is applied and the mixture is heated to 180° C. to remove all the volatile materials. The resulting modified novolak is a flexible solid for formula 1 wherein m denotes 1 for 25% of the molecule and zero for 75% of the molecule, R$^8$ denotes p-tert.butyl, R$^1$, R$^7$ and R$^9$ denote hydrogen atoms, R$^2$ denotes a group —SCH$_2$COOH, (p+nq+r) has an average value such that 50% of the aromatic rings are substituted by the group —CH(R$^1$)R$^2$ and n represents an integer of average value 7.5.

This novolak (18 g) is dissolved in acetone (40 g) and a solution of 1,2-naphthoquinone-2-diazide-5-sulphonyl chloride (6 g) in acetone (20 g) is added. The solution is adjusted to pH 8 by addition of 10% aqueous sodium carbonate solution (56 g). The mixture is stirred at room temperature for 1 hour and then added dropwise to 2N HCl (2 liters).

A yellow resinous precipitate is obtained and this is filtered off, washed with water, and dried in a vacuum oven at 35° C. to give 18.8 g of product of formula 1 wherein m denotes 1 for 25% of the molecule and zero for 75% of the molecule.

R$^8$ denotes p-tert.butyl,

R$^1$ and R$^9$ both denote hydrogen,

82% of the groups R$^7$ denote hydrogen and 18% denote 1,2-naphthoquinone-2-diazide-5-sulphonyl, R$^2$ represents a group —SCH$_2$COOH, (p+nq+r) has an average value such that 50% of the aromatic rings are substituted by the group —CH(R$^1$)R$^2$, and n represents an integer of average value 7.5.

This product can be electrocoated onto a substrate and a positive image formed, as described in Example 1.

EXAMPLE 10

A novolak is prepared by heating phenol, p-tert-.butylphenol, 4,4-bis(4-hydroxyphenyl)pentanoic acid, and formaldehyde (as 38.8% formalin) using oxalic acid as catalyst in a molar ratio 0.75:0.25:0.1:0.99:0.016. Volatile matter is removed by distillation and a novolak resin is obtained with a softening point of 119° C. The novolak (18 g) is dissolved in acetone (50 g) and treated with a solution of 1,2-naphthoquinone-2-diazide-5-sulphonyl chloride (6 g) in acetone (20 g). The mixture is adjusted to pH 8 by the addition of 10% aqueous sodium carbonate, then stirred at room temperature for 1 hour. It is then added dropwise to 0.2N HCl solution (2.5 liters); the resulting precipitate is filtered, washed with water and dried in a vacuum oven at 35° C. to give 18 g of resin.

This resin (13.8 g) is dissolved in 2-butoxyethanol (40 g) and heated to 50° C. A solution of sarcosine (0.61 g), paraformaldehyde (0.46 g; 91% (HCHO)$_x$), 20% aqueous sodium hydroxide (1 g) and 2-butoxyethanol (15 g) is added to the mixture which is kept at 50° C. for 2 hours. The product is recovered by precipitation in 0.13N hydrochloric acid solution. This is washed with water and dried in a vacuum oven at 35° C. to give 13 g of a product of formula I in which 72% of the groups R$^8$ denote p-tert.butyl and 28% denote a group of formula II where s is 1, m denotes zero for 68% of the molecule and 1 for 32% of the molecule, R$^1$ and R$^9$ denote hydrogen, 9% of the total of the groups R$^7$ in formula I and the groups R$^7$ in formula II represent 1,2-naphthoquinone-2-diazide-5-sulphonyl and 91% denote hydrogen, R$^2$ represents a group —N(CH$_3$)CH$_2$COOH, Y denotes a group

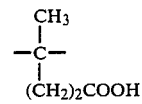

(p+nq+r+t) has an average value such that 7% of the aromatic rings are substituted by the group —CH(R$^1$)R$^2$, and n represents an integer of average value 3.8.

The product can be electrocoated onto a substrate and a positive image formed, as described in Example 1.

EXAMPLE 11

Novolak I (20 g) is dissolved in 2-butoxyethanol (50 g) and heated to 70° C. A solution of diethylamine (2.9 g), formalin (38.8% HCHO; 6.2 g), lactic acid (75%; 4.8 g) and 2-butoxyethanol (5 g) is added and the mixture stirred at 70° C. for 1 hour. The mixture is then cooled to ambient temperature and added to water (1000 ml) containing sodium hydroxide (1.6 g). The precipitate produced is filtered off, washed and dried in a vacuum oven at 35° C. to give 10.8 g of a product of formula I where m denotes zero or 1, the molar ratio m=0 to m=1 being 3:1

R$^8$ denotes p-tert.butyl,

R$^1$ and R$^9$ denote hydrogen atoms,

88% of the groups R$^7$ denote hydrogen and 12% denote 1,2-naphthoquinone-2-diazide-5-sulphonyl, R$^2$ denotes a group —N(CH$_2$CH$_3$)$_2$, (p+nq+r) has an average value such that 30% of the aromatic rings are substituted by the group —CH(R$^1$)R$^2$, and n represents an integer of average value 7.1.

The infra-red absorption spectrum of this resin, measured on a KBr disc, shows maxima at 3350, 2950, 2860, 2160, 2120, 1610, 1590, 1500, 1480, 1470, 1450, 1440, 1400, 1360, 1260, 1230, 1210, 1190, 1170, 1150, 1110, and 1080 cm$^{-1}$.

The product can be electrocoated onto a substrate and a positive image formed, as described in Example 1.

What is claimed is:

1. A phenolic novolak resin having aromatic rings substituted by phenolic hydroxyl groups, said resin being modified to render it photosensitive and electrodepositable by having
(i) at least 4% of the phenolic hydroxyl groups replaced by a quinone diazide sulfonyloxy group, the resin having sufficient free phenolic hydroxyl groups to render it soluble or dispersible in an aqueous medium, and
(ii) at least 4% of the aromatic rings substituted in a position ortho or para, or ortho and para, to a phenolic hydroxyl group or quinone diazide sulfonyloxy group by a group of formula —CH(R$^1$)R$^2$ where
R$^1$ represents a hydrogen atom,
R$^2$ represents a group of formula —SCH$_2$COOH or —N(R$^4$)—R$^3$—X,
R$^3$ represents a divalent aliphatic group of 1 to 10 carbon atoms or a phenylene group,
R$^4$ represents a hydrogen atom, a C$_1$–C$_{10}$ alkyl group or a C$_1$–C$_{10}$ alkyl group substituted by a carboxylic acid group or by a hydroxyl group, or R$^3$ and R$^4$ together represent an alkylene chain of 2 to 5 carbon atoms linked to the indicated nitrogen atom, or said chain containing an oxygen atom or an additional nitrogen atom, and X denotes a hydrogen atom, a hydroxyl group or a carboxyl acid group.

2. A resin according to claim 1 which is of formula

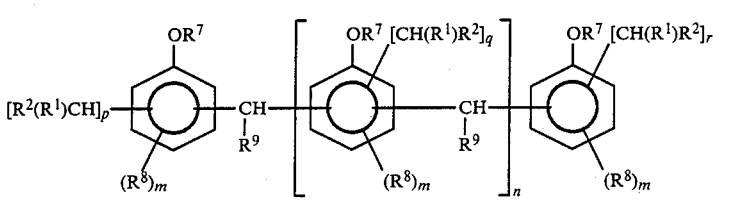

where
$R^1$ and $R^2$ are as defined in claim 1, $R^7$ represents a hydrogen atom or a group of formula $-SO_2R^{10}$, at least 4% of $R^7$ representing a group $-SO_2R^{10}$, $R^8$ represents a halogen atom, a hydroxyl, $C_1$-$C_{10}$ alkoxy, carboxylic acid, sulfonic acid or an esterified carboxylic or sulfonic acid group; a $C_1$-$C_{10}$ alkyl, alkenyl or aryl group or a $C_1$-$C_{10}$ alkyl, alkenyl or aryl group substituted by a hydroxyl group or by a carboxylic acid group; or a group of formula $-N(R^{13})R^{14}$, $-COR^{12}$, $-OCOR^{12}$, $-O-SO_2R^{10}$ or $-O-SO_2R^{11}$; or one group $R^8$ on each aromatic ring alternatively represents a group of formula

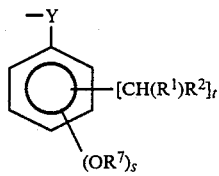

or a group of formula II connected to adjacent aromatic rings through groups of formula $-CH(R^9)-$, $R^9$ represents a hydrogen atom, $R^{10}$ represents a 1,2-benzoquinone diazide group or 1,2-naphthoquinone diazide group of formula

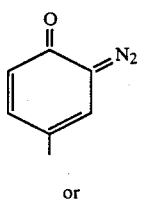

or

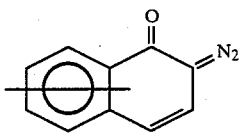

the free valency bond of the naphthoquinone group of formula IV being in the 4- or 5-position, $R^{11}$ and $R^{12}$ each represent a monovalent aliphatic, cycloaliphatic, aromatic or araliphatic group of up to 15 carbon atoms, $R^{13}$ represents a hydrogen atom, an alkyl group or a group of formula $-COR^{12}$, $-SO_2R^{10}$ or $-SO_2R^{11}$, $R^{14}$ represents a hydrogen atom or a $C_1$-$C_{10}$ alkyl group, Y represents an oxygen or sulfur atom, a carbonyl or sulfonyl group, an alkylene group of 1 to 8 carbon atoms or said alkylene group substituted by a halogen atom, a hydroxyl or etherified hydroxyl group, or a carboxyl or esterified carboxyl group, or an aryl group of 6 to 12 carbon atoms or said aryl group substituted by a halogen atom, a hydroxyl or etherified hydroxyl group or a carboxyl or esterified carboxyl group, m denotes zero, 1, 2 or 3, n denotes zero or an integer of 1 to 20, p, r and t each denote zero, 1 or 2, q denotes zero or 1, s denotes 1 or 2, the sum of $p+nq+r+t$ is such that at least 4% of the indicated aromatic rings are substituted by a group of formula $-CH(R^1)R^2$ in a position ortho or para, or ortho and para, to a group $-OR^7$, the sum of $m+p$, or $m+r$, is not more than 4, and the sum of $m+q$ is not more than 3.

3. A resin according to claim 2, in which $R^2$ represents a group of formula $-N(R^4)-R^3-X$, where $R^3$ represents an alkylene group of 1 to 6 carbon atoms, or said alkylene group substituted by a carboxylic acid group, or a phenylene group, $R^4$ represents a hydrogen atom or an alkyl group of 1 to 6 carbon atoms, or said alkyl group substituted by a hydroxyl group or by a carboxylic acid group, or $R^3$ and $R^4$ together form an alkylene chain of 4 carbon atoms containing an oxygen atom or additional nitrogen atom in the chain, or an alkylene chain of 5 carbon atoms, and X represents a hydrogen atom, a hydroxyl group, or a carboxylic acid group.

4. A resin according to claim 2, in which 10 to 75% of the groups $R^7$ represent a group of formula $-SO_2R^{10}$.

5. A resin according to claim 2, in which 10 to 50% of the groups $R^7$ represent a group of formula $-SO_2R^{10}$.

6. A resin according to claim 2, in which 7 to 75% of the indicated aromatic rings are substituted by a group of formula $-CH(R^1)R^2$.

7. A resin according to claim 1, in which the quinone diazide sulfonyloxy group is a benzo- or naphtho-quinone diazide sulfonyloxy group.

8. A resin according to claim 2, in which
m denotes zero, or
m denotes 1 and the groups $R^8$ represent the same or different alkyl group having 1 to 8 carbon atoms, or
m denotes zero for some of the indicated aromatic rings and denotes 1 for the remainder, the groups $R^8$ representing the same or different alkyl group having 1 to 8 carbon atoms.

9. A salt of a resin according to claim 2 which is soluble or dispersible in an aqueous medium.

* * * * *